United States Patent [19]

Naitoh et al.

[11] Patent Number: 4,701,919
[45] Date of Patent: Oct. 20, 1987

[54] SEMICONDUCTOR DEVICE INCORPORATING MEMORY TEST PATTERN GENERATING CIRCUIT

[75] Inventors: Mitsugu Naitoh; Yoshiyuki Suehiro, both of Kawasaki, Japan

[73] Assignee: Fujitsu Limited, Kanagawa, Japan

[21] Appl. No.: 810,143

[22] Filed: Dec. 18, 1985

[30] Foreign Application Priority Data

Dec. 20, 1984 [JP] Japan ................. 59-267460

[51] Int. Cl.$^4$ ........................... G01R 31/28
[52] U.S. Cl. .................. 371/21; 324/73 R; 371/27
[58] Field of Search ........... 371/21, 27; 324/73 R, 324/73 AT

[56] References Cited

U.S. PATENT DOCUMENTS 3,924,181 12/1975 Alderson ................. 324/73 R
4,519,078 5/1985 Komonytsky ............ 371/27 X
4,541,090 9/1985 Shiragasawa .............. 371/21

OTHER PUBLICATIONS

Konemann et al., Built-In Test for Complex Digital Integrated Circuits, IEEE Journal of Solid-State Circuits, vol. SC-15, No. 3, Jun. 1980, pp. 315–319.
Fasang, Circuit Module Implements Practical Self-Testing, Electronics, May 19, 1982, pp. 164–167.

Primary Examiner—Charles E. Atkinson
Attorney, Agent, or Firm—Armstrong, Nikaido, Marmelstein & Kubovcik

[57] ABSTRACT

In a semiconductor device comprising a memory cell array and a test pattern generating circuit, the test pattern generating circuit generates the test pattern and transmits the test pattern to the memory cell array when receiving the least significant bit signal of address signals supplied to the memory cell array and the control signal.

6 Claims, 7 Drawing Figures

Fig. 4A

BIT LINE DIRECTION →

WORD LINE DIRECTION ↓

|     | $T_0$ | $T_1$ | | | |
|-----|---|---|---|---|---|
| $WL_0$ | 0 | 1 | 0 | 1 | ---- |
| $WL_1$ | 1 | 0 | 1 | 0 | ---- |
|     | 0 | 1 | 0 | 1 | ---- |
|     | 1 | 0 | 1 | 0 | ---- |

Fig. 4B

BIT LINE DIRECTION →

WORD LINE DIRECTION ↓

|     | $T_0$ | $T_1$ | | | |
|-----|---|---|---|---|---|
| $WL_0$ | 1 | 0 | 1 | 0 | ---- |
| $WL_1$ | 0 | 1 | 0 | 1 | ---- |
|     | 1 | 0 | 1 | 0 | ---- |
|     | 0 | 1 | 0 | 1 | ---- | ns
SEMICONDUCTOR DEVICE INCORPORATING MEMORY TEST PATTERN GENERATING CIRCUIT

BACKGROUND OF THE INVENTION (1) Field of the Invention

The present invention relates to a semiconductor device incorporating a memory cell array, for example, a random-access memory (RAM), more particularly to a semiconductor device incorporating a test pattern generating circuit able to test the internal state of the memory cell array before shipment of the semiconductor device.

(2) Description of the Related Art

Generally, in a semiconductor device incorporating a memory cell array (for example, RAM) various kinds of logic circuits are provided in addition to the memory cell array for transmitting or receiving signals to or from the array.

Such logic circuits include, for example, counter circuits and arithmetic logic units (ALU). Address signals for the memory cell array are supplied from the output side of the counter circuits, and data which has been calculated in the ALU's is supplied from the output side of ALU's to the array and written into the predetermined address. Also, predetermined data read from the memory cell array is supplied to the input side of the ALU's in order, for example, to carry out predetermined calculation in the ALU's again.

In the prior art, if it was desired to test the function or the internal state of the memory cell array, the test was carried out through the above logic circuits. However, in this case, the test data to be written into the memory cell array was designated from the outside. Therefore, there was the problem that it was necessary to use a large amount of test data, resulting in poor efficiency for the testing.

In view of the above, it has been desired to provide a test circuit, within the above semiconductor device, enabling direct testing without the need for supplying test data from the outside.

However, even if such a test circuit is used, there is a problem that the test pattern constituting the test data to be written into each memory cell becomes large, especially when the capacity of the memory cell array is large. As a result, the writing of the test data for the memory cell array is still troublesome.

SUMMARY OF THE INVENTION

The present invention has been made in order to solve the above-mentioned problems. The object of the present invention is to enable automatic generation of a pattern of test data just by supplying the address signals for the memory cell array (for example, RAM), without the necessity of supplying test data from the outside.

In this connection, in one type of test pattern, generally called a "checkerboard" pattern, the test data to be written into adjacent memory cells consists of alternate "1"'s and "0"'s. This test pattern, recently known is simple, but desirable in that it can detect exactly defective parts of the memory cell array.

According to the present invention, it is possible to automatically generate such a checkerboard pattern just by supplying address signals for the memory cell array.

Namely, according to the present invention, there is provided a semiconductor device comprising: a memory cell array; a test pattern generating circuit; and means for receiving a control signal from the outside; the test pattern generating circuit generating the test pattern and transmitting the test pattern to the memory cell array when receiving the least significant bit signal of address signal supplied to the memory cell array and the control signal.

Thus, according to the present invention, if the address signals are row address signals for the memory cell array, for example, the least significant bit signal of the row address signals changes alternately between "0" and "1" every time each adjacent row address (namely, each of even row address and odd row address) is input in turn. As a result, it is possible to automatically generate the desired test pattern (the checkerboard pattern, for example), by processing logically the above least significant bit signal and the predetermined control signal.

BRIEF DESCRIPTION OF THE DRAWINGS

FIG. 4A and FIG. 4B are diagrams illustrating the test pattern generated by the test pattern generating circuit shown in FIG. 2;

DESCRIPTION OF THE PREFERRED EMBODIMENTS

Figure 1:
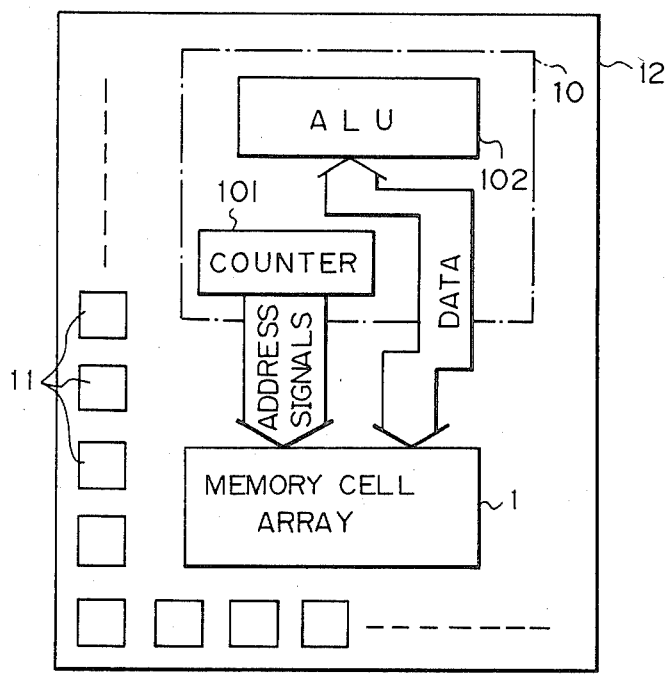
FIG. 1 is a schematic block diagram illustrating the overall constitution of a semiconductor devices to which the present invention pertains.

FIG. 1 is a schematic block diagram illustrating the overall constitution of a semiconductor device incorporating a memory cell array. As shown in FIG. 1, there are provided a memory cell array 1 (for example, RAM) and a logic circuit area 10 on a chip 12, which logic circuits transmit or receive signals (for example, address signals $A_0$ to $A_n$ and data signals $D_0$ to $D_m$) to or from the memory cell array 1.

There are provided a counter circuit 101 and an arithmetic logic unit (ALU) 102, for example, in the above logic circuit area 10. The address signals $A_0$ to $A_n$ for the memory cell array 1 are supplied from the output side of the counter circuit 101. Data $D_0$ to $D_m$ which has been calculated in the ALU 102 is supplied from the output side of ALU 102 to the memory cell array 1 and written into predetermined memory cells of the memory cell array 1. Predetermined data read from the memory cell array 1 is also supplied to the input side of the ALU 102 in order to carry out a predetermined calculation in the ALU 102 again, for example. Input and output circuits 11 are provided around the chip 12.

Signals are transmitted between the above semiconductor device and the external circuit through the I/O circuits 11.

Figure 2:
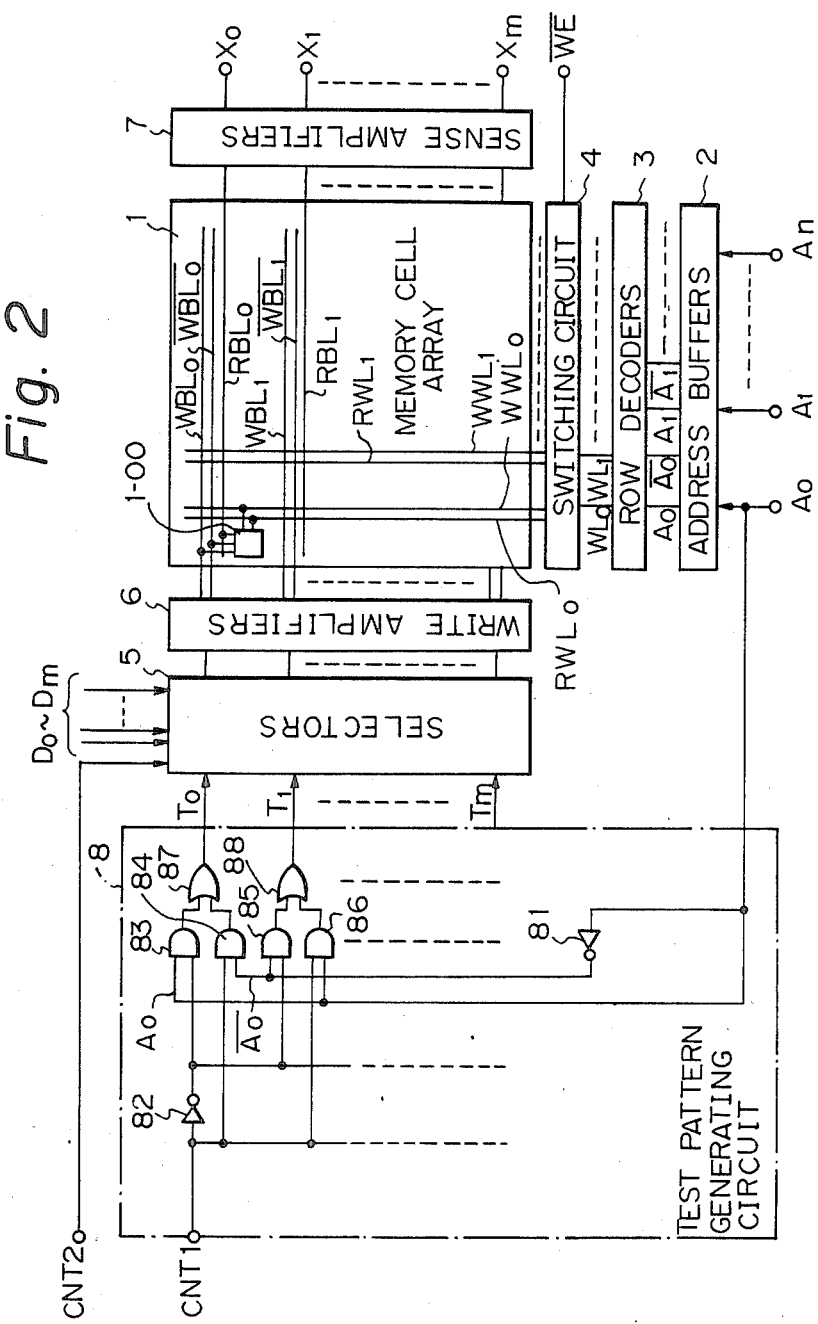
FIG. 2 is a circuit diagram illustrating the constitution of the test pattern generating circuit and the connections between the test pattern generating circuit and the memory cell array in a semiconductor device according to one embodiment of the present invention.

FIG. 2 illustrates the constitution of a test pattern generating circuit and connections between the test pattern generating circuit and the memory cell array in a semiconductor device according to one embodiment of the present invention.

In FIG. 2, there is shown a memory cell array (RAM) 1. Only row address signals $A_0$ to $A_n$ are supplied as the address signals, i.e., no column address signals are used. The row address signals $A_0$ to $A_n$ are input to the corresponding address buffers 2. The address buffers 2 output the internal row address signals $A_0$, $\overline{A_0}$ (the inverted signal of the signal $A_0$) to $A_n$, $\overline{A_n}$ (the inverted signal of the signal $A_n$), respectively, and supply these internal row address signals to the corresponding row decoders 3. The row decoders 3 select the predetermined word line (for example, $WL_0$) and supply the selecting signal (for example, high level signal) to that selected word line $WL_0$ according to the level of the above internal row address signals. In this embodiment, write word line and read word line are used as word lines. Thus, when the data is written into the memory cell array 1, the level of the write enable signal $\overline{WE}$ becomes low, and a switching circuit 4 supplies the selecting signal to the selected write word line (for example, $WWL_0$). When the data is read from the memory cell array 1, the level of the write enable signal $\overline{WE}$ becomes high, and the switching circuit 4 supplies the selecting signal to the selected read word line (for example, $RWL_0$).

Also, selectors 5 and write amplifiers 6 are connected to the data input side of the memory cell array 1. Sense amplifiers 7 are connected to the data output side of the memory cell array 1. When a control signal CNT2 supplied from the outside to the selectors 5 becomes high level, for example, the test data $T_0$ to $T_m$ supplied from the test pattern generating circuit 8 is input through the selectors 5, the write amplifiers 6, and the write bit lines $WBL_0$, $\overline{WBL_0}$, $WBL_1$, $\overline{WBL_1}$, and the like, to the memory cells connected to the selected word line in the memory cell array 1.

On the other hand, when the control signal CNT2 supplied to the selector 5 becomes low level, for example, the usual data $D_0$ to $D_m$ supplied from the logic circuit area 10 is input through the selectors 5, the write amplifiers 6, and the above write bit lines to the memory cells connected to the selected word line in the memory cell array 1.

Also, the output data $X_0$ to $X_m$ which is read from the memory cells connected to the selected word line in the memory cell array 1 is output through the read bit lines $RBL_0$, $RBL_1$, and the like, and the sense amplifiers 7.

Also, there is provided a test pattern generating circuit 8 which generates test data to be written into the memory cell array 1 to test the array 1.

In the test pattern generating circuit 8, there are provided AND gates 83, 84, 85, 86, and the like. The least significant bit signal $A_0$ of the row address signals $A_0$ to $A_n$ and the inverted signal $\overline{A_0}$ produced by inverting the signal $A_0$ through an inverter 81 are input to AND gates 83 and 84, respectively. Also, the above signals $\overline{A_0}$ and $A_0$ are input to the following AND gates 85 and 86, respectively. Similarly, the above signals $A_0$ and $\overline{A_0}$ are input to the further following AND gates in the same manner.

A control signal CNT1 is input from the outside to the AND gates 83 and 85, through an inverter 82, and to the AND gates 84 and 86 directly. Similarly, the above control signal CNT1 is input to the further following AND gates in the same manner.

The output signals of a pair of AND gates 83 and 84 are input to an OR gate 87, from where the test data $T_0$ is output. Also, the output signals of a pair of AND gates 85 and 86 are input to an OR gate 88, from where the test data $T_1$ is output. Similarly, the output signals of each pair of AND gates are input to the corresponding OR gate, from where the test data $T_0$ to $T_m$ is output.

Thus, if all of the row address signals $A_0$ to $A_n$ are low level, and the word line $WL_0$ is selected by the row decoders 3, the least significant bit signal $A_0$ of the row address signals supplied to the test pattern generating circuit 8 is also low level. Thus, the low level signal $A_0$ is input to each of AND gates 83, 86, - - - and the inverted high level signal $\overline{A_0}$ input through the inverter 81 to each of AND gates 84, 85 - - -.

At this time, if the control signal CNT1 supplied to the test pattern generating circuit 8 is set to low level, the low level control signal is input directly to each of AND gates 84, 86 - - -, and the inverted high level signal produced by inverting the control signal CNT1 through the inverter 82 is input to each of AND gates 83, 85 - - -.

As a result, both the output signals of AND gates 83 and 84 become low level, and, thus, the output signal of the OR gate 87 also becomes low level. Therefore, the test data $T_0$ is output as the low level signal (namely, "0"). On the other hand, as the output signal of the following AND gate 85 becomes high level, the output signal of the OR gate 88 also becomes high level (although the output level of the AND gate 86 is low). Thus, the test data $T_1$ is output as the high level signal (namely, "1"). Similarly, the test data $T_0$ to $T_m$ of the predetermined level is output from the test pattern generating circuit 8. As a result, when the control signal CNT2 supplied to the selectors 5 is set to high level and the write enable signal $\overline{WE}$ supplied to the switching circuit 4 is set to low level, each of the test data $T_0$ to $T_m$ which alternately changes between "0" and "1", as shown in the first row of the pattern shown in FIG. 4A, is written into each memory cell (for example, 1-00) connected to the selected write word line $WWL_0$ in the memory cell array 1.

Next, if the word line $WL_1$ is selected by changing the levels of the row address signals $A_0$ to $A_n$, then the above least significant bit signal $A_0$ supplied to the test pattern generating circuit 8 becomes high level. Therefore, at this time, each of the test data $T_0$ to $T_m$ which alternately changes between "1" and "0", as shown in the second row of the pattern shown in FIG. 4A, is written into each memory cell connected to the selected write word line $WWL_1$ in the memory cell array 1, through a similar operation as above-mentioned.

Thus, each of the test data which alternately changes between "0" and "1" as shown in FIG. 4A (namely, each of the test data constituting the above-mentioned checkerboard pattern) is written into each memory cell in the memory cell array 1.

Although in the above-mentioned embodiment, the active level of the control signal CTN1 is set to the low level, if the active level of the control signal CNT1 is set to the high level, each of the test data constituting another checkerboard pattern as shown in FIG. 4B is written into each memory cell in the memory cell array 1.

Figure 3:
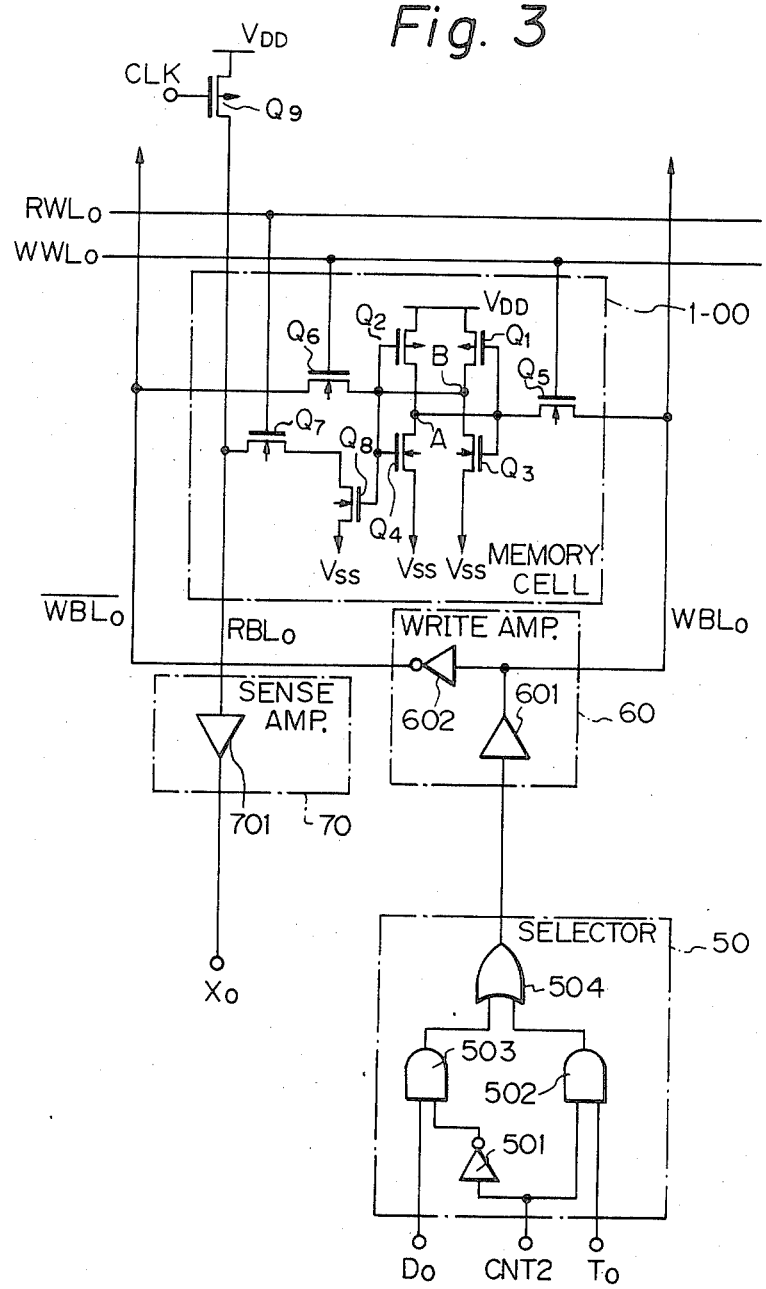
FIG. 3 is a circuit diagram illustrating an example of a memory cell in the memory cell array, and a selector, a write amplifier, and a sense amplifier connected to the memory well shown in FIG. 2.

FIG. 3 is a circuit diagram of an example of a memory cell (for example, 1-00) in the above memory cell array 1 and a selector 50, a write amplifier 60, and a sense amplifier 70 connected to the above memory cell.

As shown in FIG. 3, there are provided an inverter 501, AND gates 502 and 503, and an OR gate 504 in a selector 50. When the above-mentioned control signal CNT2 becomes high level, the test data $T_0$ supplied from the test pattern generating circuit 8 is input to the write amplifier 60 through the gates 502 and 504. On the other hand, when the control signal CNT2 becomes low level, the usual data $D_0$ supplied from the logic circuit area is input to the write amplifier 60 through the gates 503 and 504.

In the write amplifier 60, there are provided an amplifier 601 and an inverter 602. The write amplifier 60 is connected to the memory cell 1-00 through the write bit lines $WBL_0$ and $\overline{WBL_0}$. In the memory cell 1-00, there are provided a plurality of transistors $Q_1$ to $Q_8$ (among these, transistors $Q_1$ and $Q_2$ are P-channel type transistors, and transistors $Q_3$ to $Q_8$ are N-channel type transistors). The memory cell 1-00 is connected to the write bit lines $WBL_0$ and $\overline{WBL_0}$, the read bit line $RBL_0$, the write word line $WWL_0$, and the read word line $RWL_0$. A P-channel type transistor $Q_9$ is connected between the power source $V_{DD}$ and the read bit line $RBL_0$, and a clock signal CLK is supplied to the gate of the transistor $Q_9$.

When data is written into the memory cells connected to the write word line $WWL_0$, the voltage level of the selected word line WWL becomes high. At this time, if the data $T_0$ or $D_0$ of high level (namely, "1"), for example, is to be written into the memory cell 1-00 through the selector 50, the voltage level of the write bit line $WBL_0$ supplied through the amplifier 601 becomes high, and, contrary to this, the voltage level of the write bit line $\overline{WBL_0}$ supplied through the amplifier 601 and the inverter 602 becomes low.

Thus, in the memory cell 1-00, the transistor $Q_5$ turns on, and the voltage level of the connection point A between the transistors $Q_2$ and $Q_4$ becomes high. Thus the data "1" is written into the memory cell 1-00. Further, at this time, the transistor $Q_6$ also turns on, and the voltage level of the connection point B between the transistors $Q_1$ and $Q_3$ becomes low. Thus, the above-mentioned high level voltage at the connection point A is latched. In this connection, when the data is written into the memory cell, the clock signal CLK becomes low level, and, thus, the memory cell 1-00 is charged up through the P-channel type transistor $Q_9$ and the read bit line $RBL_0$ by the power source $V_{DD}$.

When the data is read from the memory cells connected to the read word line $RWL_0$, the voltage level of the selected word line $RWL_0$ becomes high, and, thus, the transistor $Q_7$ turns on. at this time, the above clock signal CLK becomes high level, and the transistor $Q_9$ turns off.

When the data "1" has been written into the memory cell 1-00 as above-mentioned, the transistor $Q_8$ turns off (because the gate level of the transistor $Q_8$ is low level). Thus, the high level data $X_0$ produced by the above-mentioned charging up is output through the transistor $Q_7$, the read bit line $RBL_0$, and the sense amplifier 70 in which an amplifier 701 is provided.

Contrary to this, if the data "0" is written into the memory cell 1-00, the transistor $Q_8$ turns on (because the gate level of the transistor $Q_8$ becomes high). Thus, the level of the read bit line $RBL_0$ becomes low (namely, the level of $V_{ss}$) by the discharging through the transistor $Q_8$, and the low level data $X_0$ is output through the sense amplifier 70.

Figure 5:
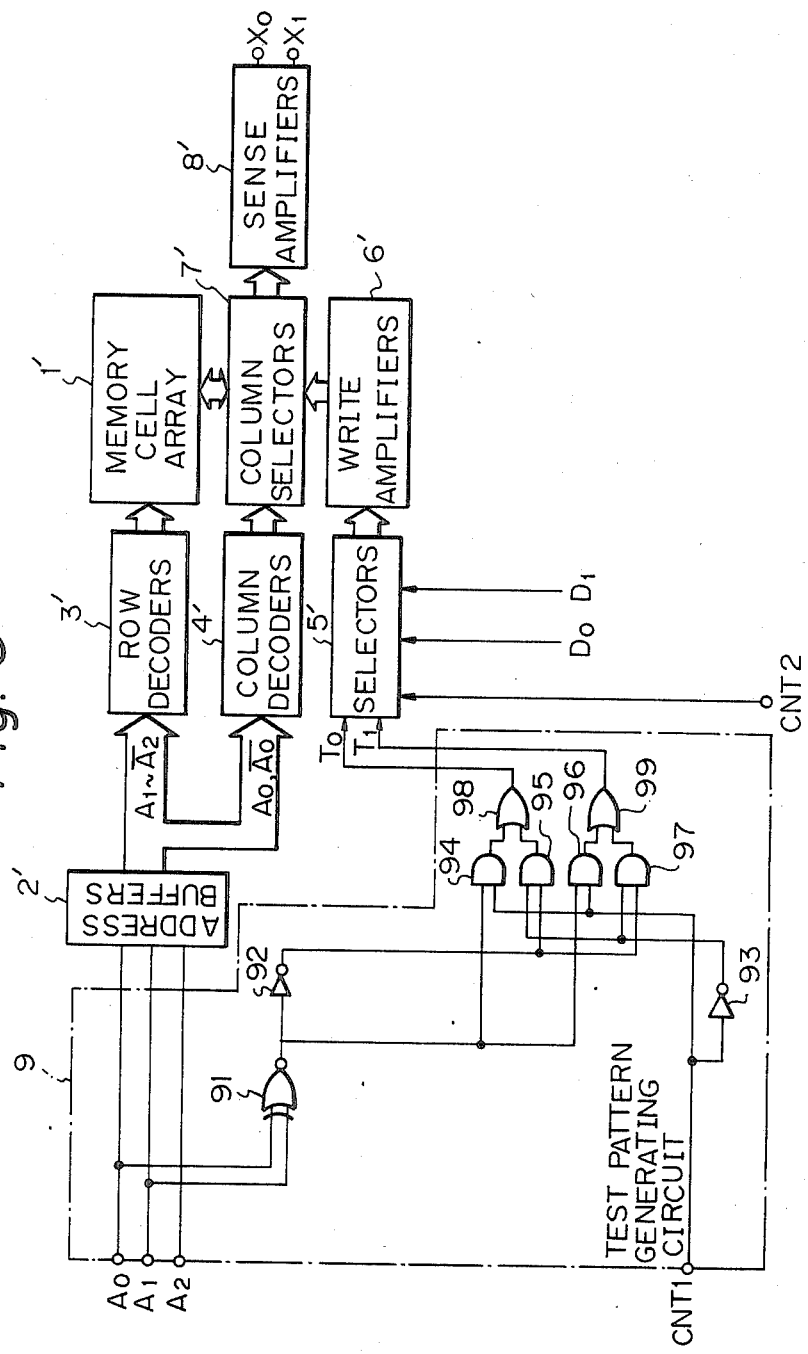
FIG. 5 is a circuit diagram illustrating the constitution of the test pattern generating circuit and the connections between the test pattern generating circuit and the memory cell array in a semiconductor device according to another embodiment of the present invention.

FIG. 5 illustrates the constitution of the test pattern generating circuit and the connections between the test pattern generating circuit and the memory cell array in a semiconductor device according to another embodiment of the present invention.

In FIG. 5, there is shown the memory cell array (RAM) 1' to which both row address signals and column address signals are supplied as address signals.

As shown in FIG. 5, there are provided address buffers 2', row decoders 3', column decoders 4', selectors 5', write amplifiers 6', column selectors 7', and sense amplifiers 8'.

Figure 6:
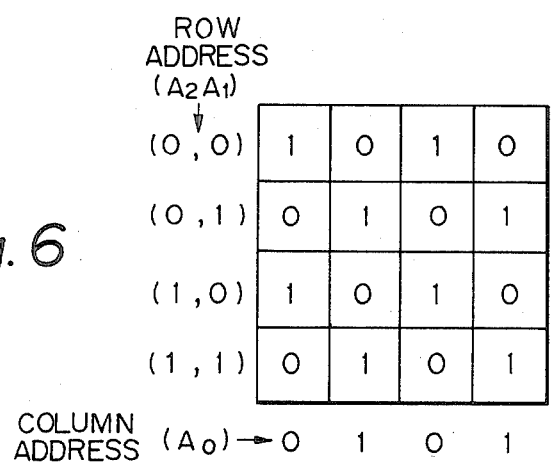
FIG. 6 is a diagram illustrating the test pattern generated by the test pattern generating circuit shown in FIG. 5.

In the embodiment shown in FIG. 5, the memory cell array 1' is physically constituted in the size of four row addresses and four column addresses, as shown in FIG. 6. The address signals $A_0$ to $A_2$ are input to the corresponding address buffers 2'. The address buffers 2' output the internal column address signals $A_0$ and $\overline{A_0}$ and the internal row address signals $A_1$, $\overline{A_1}$, $A_2$, and $\overline{A_2}$ and supply these internal address signals $A_0$ to $\overline{A_0}$ and $A_1$ to $\overline{A_2}$ to each of the column decoders 4' and the row decoders 3'.

The row decoders 3' select the predetermined row address according to the level of the internal row address signals $A_1$ to $A_2$. Also the column decoders 4' select the predetermined column address according to the level of the internal column address signals $A_0$ and $\overline{A_0}$.

Also, the selectors 5' and the write amplifiers 6' are connected to the data input side of the column selectors 7'. The sense amplifiers 8' are connected to the data output side of the column selectors 7'.

At the time that the data is to be written into the memory cell array by the control of the usual write enable signal, if a control signal CNT2 supplied from the outside to the selectors 5' becomes high level, for example, the test data of two bits $T_0$ and $T_1$ supplied from the test pattern generating circuit 9 are input through the selectors 5', the write amplifiers 6', and the column selectors 7' to the predetermined memory cells in the memory cell array 1'. Contrary to this, if the control signal CNT2 becomes low level, for example, the usual data of two bits $D_0$ and $D_1$ supplied from the logic circuit area 10 is input through the selectors 5', the write amplifiers 6', and the column selectors 7' to the predetermined memory cells in the memory cell array 1'.

On the other hand, at the time that the data is to be read from the memory cell array 1', the data $X_0$ and $X_1$ is output from the predetermined memory cells through the column selectors 7' and the sense amplifiers 8'.

In this connection, the column selectors 7' select two column addresses as the addresses to or from which the above data of two bits are input or output, according to the output level of the column decoders 4'.

Also, there is provided a test pattern generating circuit 9 which generates the test data to be written into the memory cell array 1' in order to test the memory cell array 1'.

In the test pattern generating circuit 9, there is provided an exclusive NOR gate 91 to which both of the least significant bit signal $A_1$ of the row address signals and the least significant bit signal $A_0$ of the column address signals are supplied. In this connection, there is only one bit signal $A_0$ for the column address signal in this embodiment, and therefore, the above signal $A_0$ is also the least significant bit signal of the column address signals.

The output signal of the exclusive NOR gate 91 becomes high level when both levels of the above supplied signals coincide (namely, both high or both low), and becomes low level when the levels of the above supplied signals do not coincide.

The output signal of the exclusive NOR gate 91 is input to each of the AND gates 94 and 96 directly and is input to each of the AND gates 95 and 97 through an inverter 92. Further, a control signal CNT1 is input from the outside to each of the AND gates 94 and 96 directly and is input to each of the AND gates 95 and 97 through an inverter 93. The output signals of a pair of AND gates 94 and 95 are input to an OR gate 98, from where the test data $T_0$ is output. Similarly, the output signals of a pair of AND gates 95 and 97 are input to an OR gate 99, from where the test data $T_1$ is output. Then, the test data $T_0$ and $T_1$ is input to the above-mentioned selectors 5'.

When the test data is to be written into each memory cell in the memory cell array 1', if all of the address signals $A_0$ to $A_2$ are set to the low level, the output level of the exclusive NOR gate 91 becomes high. Thus, the above high level signal is supplied to AND gates 94 and 96 directly, and the low level signal produced by inverting that high level signal through the inverter 92 is supplied to the AND gates 95 and 97.

Also, if the active level of the control signal CNT1 is high level, the high level control signal CNT1 is supplied to the AND gates 94 and 96 directly, and the low level signal produced by inverting that control signal CNT1 through the inverter 93 is supplied to the AND gates 95 and 97.

As a result, each output level of the AND gates 94 and 96 becomes high, and, thus, each output level of OR gates 98 and 99 (namely, each level of the test data $T_0$ and $T_1$) becomes high.

Thus, the high level test data "1" is written into the predetermined two memory cells arranged at the intersection of the row address selected when the row address signals $A_1$ and $A_2$ are both low level (namely, the top row address in the pattern shown in FIG. 6) and each of two column addresses selected when the column address signal $A_0$ is low level (namely, the first and third column addresses from the left side in the pattern shown in FIG. 6).

Similarly, if the address signals $A_0$ and $A_2$ are set to the high level and the address signal $A_1$ is set to the low level, all output levels of AND gates 94 to 97 become low, and, as a result, each output level of the OR gates 98 and 99 (namely, each level of the test data $T_0$ and $T_1$) becomes low.

Thus, the low level test data "0" is written into the predetermined two memory cells arranged at the intersection of the row address selected when the row address signals $A_1$ and $A_2$ are low level and high level respectively (namely, the third row address from the top side in the pattern shown in FIG. 6) and each of two column addresses selected when the column address signal $A_0$ is high level (namely, the second and fourth column addresses from the left side in the pattern shown in FIG. 6).

Further, by repeating a similar operation, each test data constituting the checkerboard pattern as shown in FIG. 6 is written into each memory cell in the memory cell array 1'.

In this connection, if the active level of the control signal CNT1 is set to the low level, it is obvious that each data written into each memory cell is inverted.

As described above, according to the present invention, it is possible to automatically generate a pattern of the test data (for example, a checkerboard pattern) and to transmit the test pattern to the memory cell array just by supplying address signals for the memory cell array, without the necessity of supplying test data from the outside.

We claim:

1. A semiconductor device comprising:
    a memory cell array accessed by address signals;
    a test pattern generating circuit means for generating test pattern data in response to receiving and logically processing a part of said address signals and a control signal, wherein the pattern of said data is changed in accordance with change of said part of said address signals; and
    a selector operatively connecting said memory cell array and said test pattern generating circuit means, wherein said test pattern data is transmitted through said selector to said memory cell array in a test mode.

2. A semiconductor device according to claim 1, wherein the part of said said address signals logically processed by said test pattern generating circuit means is a least significant bit signal.

3. A semiconductor device according to claim 2, wherein said test pattern is generated in said test pattern generating circuit means by logically processing said least significant bit signal, the inverted signal of said least significant bit signal, said control signal, and the inverted signal of said control signal.

4. A semiconductor device according to claim 2, wherein said test pattern is generated in said test pattern generating circuit means by logically processing said least significant bit signal of row address signals, said least significant bit signal of column address signals, said control signal, and the inverted signal of said control signal.

5. The semiconductor device of claim 1, wherein said test pattern generating circuit means comprises:
    at least a first and a second part of AND gates,
    wherein a first AND gate of said first pair receives one input from said control signal, and a second input from an inverted signal of at least significant bit signal of said part of said address signals, and
    wherein a second AND gate of said first pair receives one input from an inverted signal of said control signal, and a second input from said least significant bit signal of said part of said address signals, and
    wherein a first AND gate of said second pair receives one input from said inverted control signal and a second input from said inverted least significant bit signal of said part of the address signals, and
    wherein a second AND gate of said second pair receive one input from said control signal and a second input from said least significant bit signal of said part of the address signals, and
    wherein the outputs of said first pair of AND gates are input to a first OR gate, and the outputs of said second pair of AND gates are input to a second OR gate, the outputs of said first and second OR gates being connected to said selector, such that upon the providing of said control signal, the outputs of said first and second OR gates are opposite one another.

6. The semiconductor device of claim 1, wherein said test pattern generating circuit means comprises:
   at least a first and a second pair of AND gates; and
   an exclusive NOR gate receiving an input from a least significant bit signal of column address signals from said part of said address signals and another input from a least significant bit signal of row address signals from said part of said address signals,
   wherein a first AND gate of said first pair receives one input from said control signal, and a second input from the output of said exclusive NOR gate, and
   wherein a second AND gate of said first pair receives one input from an inverted signal of said control signal, and a second input from an inverted signal from the output of said exclusive NOR gate, and
   wherein a first AND gate of said second pair receives one input from said inverted control signal and a second input from said inverted signal from the output of said exclusive NOR gate, and
   wherein a second AND gate of said second pair recevies one input from said control signal and a second input from the output of said exclusive NOR gate, and
   wherein the outputs of said first pair of AND gates are input to a first OR gate, and the outputs of said second pair of AND gates are input to a second OR gate, the outputs of said first and second OR gates being connected to said selector, such that upon the providing of said control signal, the outputs of said first and second OR gates are the same.

* * * * *